(12) United States Patent
Fedder et al.

(10) Patent No.: US 11,856,708 B2
(45) Date of Patent: Dec. 26, 2023

(54) STRETCHABLE 3D-PRINTED CIRCUIT BOARDS

(71) Applicant: CARNEGIE MELLON UNIVERSITY, Pittsburgh, PA (US)

(72) Inventors: Gary K. Fedder, Turtle Creek, PA (US); Rahul Panat, Pittsburgh, PA (US); Jacob Brenneman, Pittsburgh, PA (US); Derya Z. Tansel, Pittsburgh, PA (US)

(73) Assignee: CARNEGIE MELLON UNIVERSITY, Pittsburgh, PA (US)

(*) Notice: Subject to any disclaimer, the term of this patent is extended or adjusted under 35 U.S.C. 154(b) by 0 days.

(21) Appl. No.: 17/699,446

(22) Filed: Mar. 21, 2022

(65) Prior Publication Data

US 2022/0304160 A1 Sep. 22, 2022

Related U.S. Application Data

(60) Provisional application No. 63/164,003, filed on Mar. 22, 2021.

(51) Int. Cl.
*H05K 1/02* (2006.01)
*H05K 3/30* (2006.01)
(Continued)

(52) U.S. Cl.
CPC ......... *H05K 3/0064* (2013.01); *H05K 1/0393* (2013.01); *H05K 3/40* (2013.01)

(58) Field of Classification Search
CPC ...... H05K 1/02; H05K 1/0318; H05K 1/0281; H05K 1/0366; H05K 1/0393; H05K 1/147; H05K 1/185; H05K 3/0054; H05K 3/30; H05K 3/40; H05K 3/284; H05K 3/361; H05K 3/4691; H05K 2201/015; H05K 2201/0154; H05K 2201/0909; H05K 2201/2009; H05K 2201/09109; H05K 2201/10098; H05K 2201/10409; (Continued)

(56) References Cited

U.S. PATENT DOCUMENTS 5,162,260 A * 11/1992 Leibovitz ............ H01L 23/5226
257/E23.145
5,206,463 A * 4/1993 DeMaso .............. H05K 3/4691
174/262

(Continued)

OTHER PUBLICATIONS

Brenneman et al., "Interfacial delamination and delamination mechanism maps for 3D printed flexible electrical interconnects", Extreme Mechanics Letters 43 (2021) 101199.
(Continued)

*Primary Examiner* — Xiaoliang Chen
(74) *Attorney, Agent, or Firm* — KDW Firm PLLC

(57) ABSTRACT

Disclosed herein are devices comprising stretchable 3D circuits and methods for fabricating the circuits. The fabrication process includes providing in the elastomeric polymer as a substrate and providing conductive interconnects within the substrate encased in an insulating polymer, such as polyimide, to provide a stiffness gradient between the conductive interconnects and the flexible elastomeric substrate. The circuit may be fabricated as a multilayer construction using three-dimensional pillars as vias and as external interconnects to the circuit.

40 Claims, 5 Drawing Sheets

(51) Int. Cl.
*H05K 3/40* (2006.01)
*H05K 3/00* (2006.01)
*H05K 1/03* (2006.01)

(58) Field of Classification Search
CPC .............. A61N 1/0543; A61N 1/36043; A61N 1/36046; A61B 5/03; A61B 5/076; A61B 5/686
USPC ............ 174/250, 254, 262; 361/679.56, 749, 361/752, 757; 29/825, 830, 852, 679.56, 29/749, 752, 757
See application file for complete search history.

(56) References Cited

U.S. PATENT DOCUMENTS

| | | | | |
|---|---|---|---|---|
| 5,399,528 | A * | 3/1995 | Leibovitz | H05K 3/4647 438/692 |
| 10,462,897 | B2 | 10/2019 | Fedder et al. | |
| 10,504,826 | B1 * | 12/2019 | Fillion | H01L 24/20 |
| 2001/0023532 | A1 * | 9/2001 | Fujii | H01L 21/4857 29/830 |
| 2009/0075198 | A1 * | 3/2009 | Nomura | G03F 7/0226 430/286.1 |
| 2013/0180764 | A1 * | 7/2013 | Wurzel | H05K 3/361 29/830 |
| 2014/0144994 | A1 * | 5/2014 | Conner | G06K 19/07783 235/492 |
| 2014/0177181 | A1 * | 6/2014 | Malek | H05K 9/0028 361/752 |
| 2015/0070840 | A1 * | 3/2015 | Rappoport | G06F 1/1633 174/254 |
| 2015/0351648 | A1 * | 12/2015 | Harvey | A61B 5/076 600/561 |
| 2017/0027058 | A1 * | 1/2017 | Perkins | H01L 23/60 |
| 2017/0165476 | A1 * | 6/2017 | Greenberg | A61N 1/36046 |
| 2017/0317261 | A1 * | 11/2017 | Ozturk | H10N 10/80 |
| 2018/0242451 | A1 * | 8/2018 | Chopra | H01L 24/32 |
| 2019/0051553 | A1 * | 2/2019 | Kamin | H01L 21/6836 |
| 2019/0189646 | A1 * | 6/2019 | Watanabe | H05K 3/34 |
| 2019/0387619 | A1 * | 12/2019 | Vasquez Quintero | H05K 3/0014 |
| 2020/0255791 | A1 * | 8/2020 | Yeo | A61B 5/14532 |
| 2021/0118786 | A1 * | 4/2021 | Kuo | H01L 23/5383 |
| 2021/0272931 | A1 * | 9/2021 | Patil | H01L 21/6835 |
| 2022/0227952 | A1 * | 7/2022 | Syed | B32B 27/12 |
| 2022/0299719 | A1 * | 9/2022 | Yu | G02B 6/12002 |
| 2022/0304150 | A1 * | 9/2022 | Syed | B32B 7/12 |
| 2022/0409070 | A1 * | 12/2022 | Quan | A61B 5/02108 |

OTHER PUBLICATIONS

Tansel et al., "Mechanical characterization of polydimethylsiloxane (PDMS) exposed to thermal histories up to 300° C. in a vacuum environment", J. Micromech. Microeng. 30(6) (2020).

* cited by examiner

STRETCHABLE 3D-PRINTED CIRCUIT BOARDS

RELATED APPLICATIONS

This application claims the benefit of U.S. Provisional Patent Application No. 63/164,003, filed Mar. 22, 2021, the contents of which are incorporated herein in their entirety.

BACKGROUND

Traditional printed circuit boards (PCBs), upon which nearly all modern electronics are based, are mainly rigid, meaning that they are incapable of bending or stretching to any useful degree without damaging the board. However, for some applications, for example, wearable devices, mobile phones requiring bendable connections and applications involving warped surfaces, bendable and stretchable printed circuit boards are highly desirable.

Flexible PCBs are known in the art. Their main benefit is the mechanical property of being flexible, which has enabled a wide variety applications. Many such applications use the flexibility feature only once, for example, to conform the PCB to a warped surface (e.g. in automotive applications). However, these types of flexible PCBs can only conform to simple surface topographies and, if stretching of the PCB is required, the flexible PCB is likely to reach its mechanical limits.

Thus, it would be desirable to provide a PCB that is not only flexible but is also stretchable. This technology enables, for example, integration of the PCBs into textiles to enable wearable systems that are able to follow the shape and movements of the human body.

Currently known methods of manufacturing produce stretchable PCBs exhibiting undesirable qualities. One approach embeds commercial flexible printed-circuit boards (flex PCBs) in polydimethylsiloxane (PDMS). Generally, the resulting systems have significant thickness and, while there are examples of embedding multiple flex PCBs in PDMS, these methods require relatively complex manual manipulation of the PCBs to align them. A second approach employs liquid metal or conductive polymers as interconnects. These systems also tend to be thicker, though in principle can be made thin. However, liquid metal stains surfaces when left exposed and it is also not known to be truly safe for chronic application on the skin. Also, conductive polymers are much lower in electrical conductivity which limits their utility in circuits.

Thus, currently known methods produce PCBs that are too thick to be able to allow them to conform to the skin, but rather produce PCBs that are stuck on with adhesive or using a second mechanical layer, which may be invasive and irritating for the wearer of the device. Further, effective and economically feasible methods of producing multi-layer stretchable PCBs to allow more complex circuits and to be able to incorporate circuit components into the stretchable PCB are unknown.

SUMMARY

The invention described herein is an improvement on previous technologies for producing stretchable circuit boards. PCBs produced in accordance with the process described herein are ultra-thin, multi-layer stretchable 3D circuit boards. The invention focuses on multi-layer stretchable interconnected circuits that can be very thin (i.e., less than 0.1 mm in thickness), such that they can easily be incorporated into textiles or applied directly to the skin like a paper-thin decal. This thickness scale allows the PCB to conform to the skin even when the skin is wrinkling, bending or folding. Thicker systems do not allow this. The result is a less invasive solution which is less noticeable to the user during chronic wear, and which results in less long-term skin irritation.

The process and the resulting stretchable PCBs of the invention also produce circuit interconnects between layers of a multi-layer circuit, which are necessary on all but the very simplest of electronic systems. Even two interconnect layers enable crossing of wiring to allow greater freedom in connections. More layers provide greater density of interconnect which, for example, may be necessary in future sensor imaging systems formed from regular arrays of sensors. The component interconnect scheme enables modern CMOS and MEMS sensors to be included in the system, where they mechanically appear as tiny rigid islands, generally no more than 2 mm across, and that do not impact the overall substrate thickness and its conformity to the skin.

Thus, disclosed herein is an end-to-end process flow to provide stretchable interconnects in elastomeric substrates like polydimethylsiloxane (PDMS) that extends to multi-layers and which includes printed three-dimensional solid or hollow vias, creating direct 3D-printed stretchable multi-layer printed circuit boards. Interconnects are made through aerosol-jet printing (AJP) steps forming polymer-conductor-polymer (e.g., polyimide-silver-polyimide) layers where the polymer acts as an electrical insulator and mechanical intermediate-stiffness element and the conductor (e.g., metal or other conducting material such as a conducting polymer) acts as the electrically conducting wire. In one exemplary embodiment, the polymer is polyimide and the metal is silver. Sequential interconnect layers are embedded in PDMS and connected by AJP vias. Stiffness gradients can be designed in the substrate to assist with inhibition of delamination of interconnected components embedded in the PDMS.

BRIEF DESCRIPTION OF THE DRAWINGS

By way of example, a specific exemplary embodiment of the disclosed system and method will now be described, with reference to the accompanying drawings, in which.

DETAILED DESCRIPTION

The invention disclosed herein includes a multi-layer stretchable interconnected circuit or device that is very thin (i.e., less than 1 mm in thickness), such as to be able to be conformally bonded to an irregular surface and to flex and stretch with the surface to which it is bonded. The invention also provides for a component interconnect scheme that can enable modern complementary metal oxide semiconductor (CMOS) and micro-electromechanical systems (MEMS) sensors to be included in the device, wherein they mechanically appear as tiny rigid islands (e.g., generally no more than 1 or 2 mm across and thinned to 50-100 microns) and, as such, do not impact the overall thickness of the device and its conformity to the skin.

The invention is relevant to applications including skin-wearable health and fitness monitoring systems, "stick-on" systems for robotics and interactive devices, skin-wearable electronic cosmetics, and as a general stretchable circuit technology to embed within larger systems (e.g., within or on an exo-skeleton).

In some embodiments, the invention includes an end-to-end process flow to provide stretchable interconnects in elastomeric substrates, such as polydimethylsiloxane (PDMS), that can extend to multi-layers. In some embodiments, an intended leading application of the invention is to make sub-mm-thick stretchable electronic systems at a thickness that conforms to skin. However, in other embodiments, the invention can be deployed in thicker substrates. Other spin-cast or solution cast substrates, particularly other elastomeric materials such as Ecoflex® (platinum-catalyzed silicones) or other silicone derivatives, can be used in place of PDMS.

Figure 1:
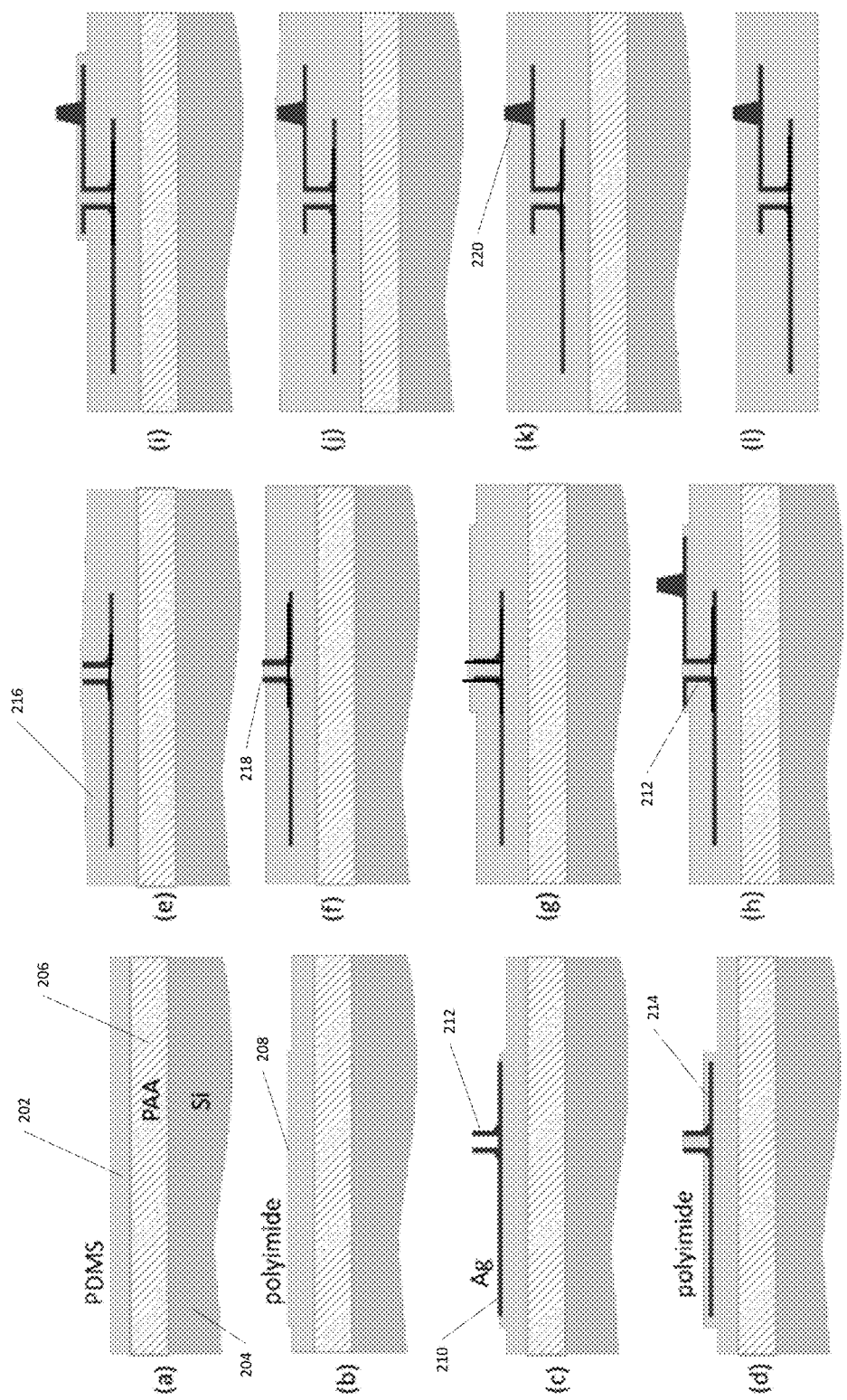
FIG. 1 comprises a series of schematic diagrams illustrating the basic process flow for production of the stretchable PCBs of the invention.

An exemplary embodiment for producing a device in accordance with the invention is shown in a step-wise fashion in FIG. 1. In a first step, shown in FIG. 1(a), a first elastomeric substrate layer 202 can be spin cast onto a substrate 204 (e.g., a silicon wafer) that has a base layer 206 of polyacrylic acid (PAA), which, in a later step of the process will serve as a mechanical release layer. In preferred embodiments, the elastomeric layer 202 is composed of PDMS, however, other elastomeric substances may also be used. Elastomeric layer 202 should be thermally cured in accordance with the manufacturer's recommendations before proceeding to the next step. However, in some embodiments, the elastomeric layer 202 is exposed to higher temperatures than recommended by the manufacturer, in which case the curing is generally done in an oxygen-free environment to prevent material degradation.

Interconnections can be made through polymer-conductor-polymer layers which, in preferred embodiments, can be printed using an aerosol-jet printing (AJP) process and where the polymer can be polyimide and the conductor can be silver. In other embodiments, other processes for jetting the polyimide-silver-polyimide layers may be used, for example, inkjet printing. FIG. 1(b) shows the deposit of a polyimide layer 208 preferably deposited by AJP. Polyimide layer 208 may be of any width such as to accommodate one or more interconnections. After deposition, polyimide layer 208 should undergo a thermal annealing process to cure it. In some embodiments, curing of polyimide is performed at high temperatures between approximately 200° C. to approximately 300° C. to fully cure the material, leading to a need for all layers to be annealed previously at this temperature to eliminate outgassing in lower layers.

In the next step, shown in FIG. 1(c), one or more conductive interconnects 210 are deposited. The conductive interconnects may be comprised of, for example, silver, gold, platinum, copper, nickel, a conductive polymer, etc. For simplicity in explaining the invention, the exemplary device shown in FIG. 1 is using silver as the conductive interconnects. Preferably, conductive layer 210 is deposited in nano-particle form by an AJP process. Because the AJP process is being used, any conductive material in nano-particle form could possibly serve to form the conductive interconnects. Also deposited in this step may be one or more three-dimensional pillars 212, which serve as either interconnects to other layers of the device or as external connection points. Pillars 212 are generally cylindrical in nature. The construction of the pillars 212 will be discussed in more detail later. As previously mentioned, one or more interconnects 210 may be deposited on the layer of polyimide 208. In preferred embodiments, interconnects 210 are deposited in a meandering pattern as shown in FIG. 2(a) such that when the circuit is laterally stretched, interconnects 210 do not break.

After deposition of the one or more interconnects 210 and one or more pillars 212, the conductive material is sintered to coalesce the nano-particles into a solid mass. In some embodiments, an AJP of silver nano-particles can be sintered at high temperatures between approximately 200° C. to approximately 300° C. to reach high electrical conductivity, leading to a need for all layers to be previously annealed at this temperature to eliminate outgassing in lower layers.

FIG. 1(d) shows the next step of the process in which an additional layer of polyimide 214 is deposited on conductive interconnects 210 such as to encase and seal interconnects 210 within a solid mass of polyimide comprised of lower layer 208 and upper layer 214. Note that some portions of conductive interconnects 210, for example, portions of the conductive interconnect 210 connecting to other components of the circuit, may not be encased within the polyimide 208, 214, as shown in FIG. 2(a). The polyimide layers 208, 214 form a material stiffness gradient between conductive interconnects 210 and PDMS layer 202. After deposition of the upper layer of polyimide 214, the polyimide 214 is annealed to cure it in a similar manner as the lower layer 208.

FIG. 1(e) shows the next step of the process in which an additional layer of PDMS 216 is deposited over the first layer of the circuit. As with the first layer of PDMS 202, PDMS layer 216 may deposited by a spin coat process. FIG. 1(f) shows PDMS layer 216 being trimmed to expose a top portion 218 of pillar 212 such as to allow connection of pillar 212 to either the next upper layer of the device or to an outside connection. In an exemplary embodiment, this trimming is performed by a timed wet etch of the PDMS in an appropriate solvent.

FIGS. 1(g-k) show the fabrication of an additional layer of the exemplary circuit. Note that in this case pillar 212, as shown in FIG. 1(h) acts as a via between the first and second layers of the circuit, while pillar 220, as shown in FIG. 1(k) acts as an external connection point for the circuit. In theory, multiple additional layers could be added to the exemplary circuit utilizing the same processes described above with the first layer. FIG. 1(i) shows separation of the stretchable circuit from the substrate. When PAA is used as the sacrificial layer, release of the circuit can be accomplished by exposing PAA layer 206 to a solvent, for example, saltwater, such as to dissolve PAA layer 206 and release the circuit from silicon substrate 204. Other solvents may be used when sacrificial layer 206 is composed of a different sacrificial material. The remaining circuit, encased in a PDMS substrate, exhibits the desirable flexible and stretchable characteristics previously described, while still maintaining an extremely thin aspect when compared to prior art devices.

Figure 2:
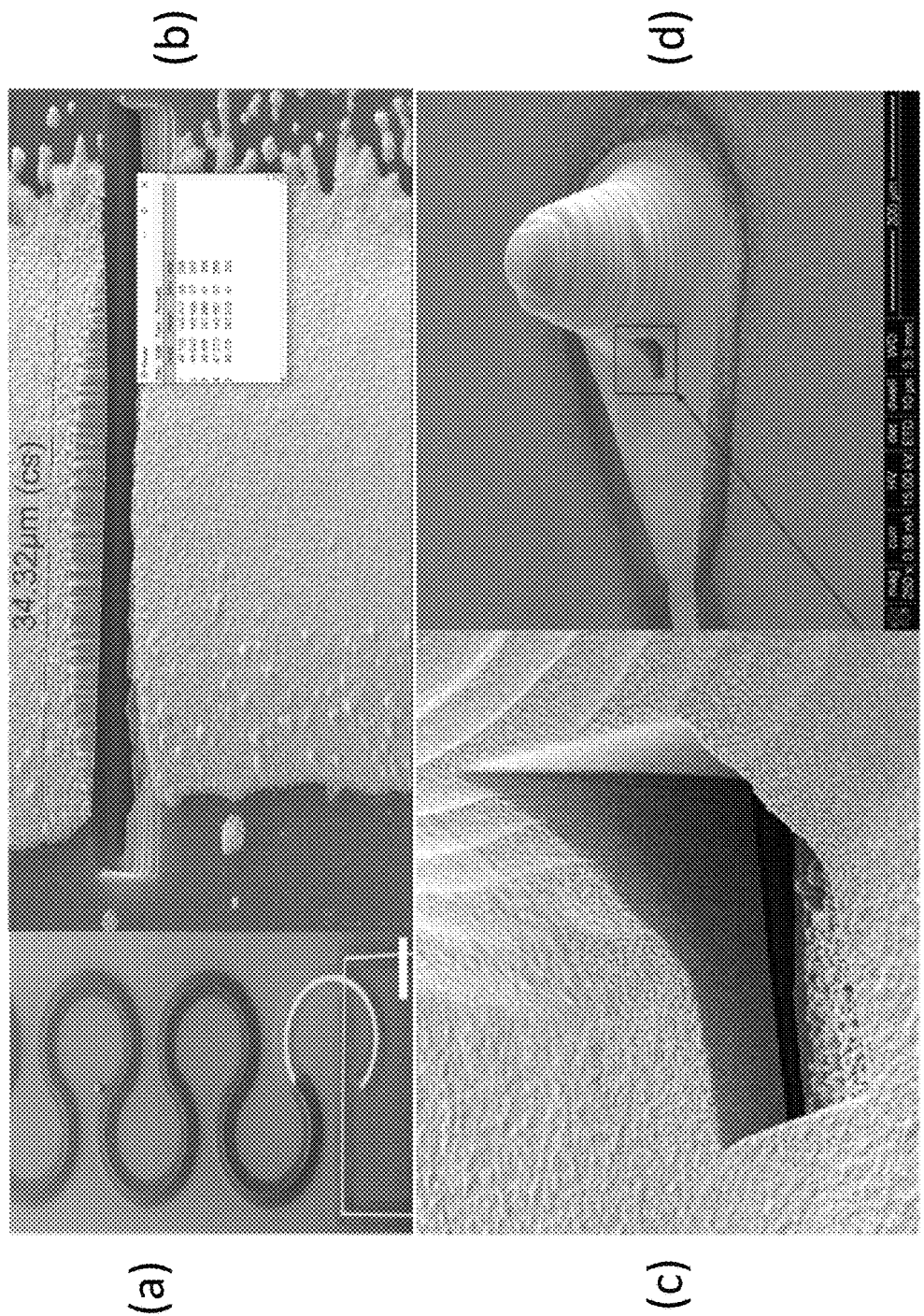
FIG. 2 shows several SEM images of various components of exemplary circuits produced in accordance with the process disclosed herein.

In one aspect of the invention, one key element comprises the use of a metal nano-particle sintering process having specific features in its thermal profile to ensure low resistivity metal interconnect simultaneous with PDMS that can maintain its elastic quality. Thermal treatments can be performed with various equipment, such as in an oven, on a hotplate or with a photonic sintering system. In some embodiments, AJP silver in nano-particle form can provide electrical conductivity when sintered in an ambient environment that includes oxygen, which assists in removing organics in the nano-particle ink. However, in some embodiments, PDMS (e.g., Sylgard 184, made by Dow Corning Corp.) should be in an oxygen-free ambient environment when exposed to temperatures at or above approximately 200° C. to avoid oxidation and subsequent cracking and hardening. In some embodiments, high-temperature silicone materials exist that may relieve this constraint, though Sylgard 184 silicone is a leading candidate as it is approved for medical use. In some embodiments, substantive removal of organics in silver nano-particle ink can occur by first ramping to an intermediate temperature (e.g., ~150° C.) and holding for a specified time (e.g., ~15 min) in air (i.e., an ambient environment with oxygen). In some embodiments, this intermediate temperature step can be lower than the threshold for PDMS where cracking in PDMS occurs. Subsequently, in some embodiments, the ambient environment can be switched to a vacuum (e.g., <1 T) and the temperature ramped to 200° C. to 300° C. to better densify and further sinter the silver. In other embodiments, all other steps aside from the silver sintering step, can be done by ramping the temperature in a vacuum to approximately 300° C. In some embodiments, the invention can include an intermediate drying step (e.g., ~150° C. for ~15 min or more) after silver encapsulation by polyimide to dry the polyimide layers and to prevent vapor pressure from building up in the silver region that otherwise could lead to interfacial delamination between the polyimide layers. FIG. 2(a) shows an exemplary polyimide-silver-polyimide interconnect on PDMS, along with a SEM image shown in FIG. 2(b) of a focused-ion-beam cut of the interconnect and pillars, shown in FIGS. 2(c-d) to indicate excellent sintering with no voids or cracks.

In a second key element of the invention, AJP three-dimensional pillars act as vias between a polymer-conductor-polymer interconnect layer and an $(i+1)^{th}$ polymer-conductor-polymer interconnect layer, where i is any layer from 1 to the total number of interconnect layers. In some embodiments, pillars may be stacked from layer to layer to provide a via between a first interconnect layer and a second interconnect layer which may be more than one layer above the first interconnect layer.

In some embodiments, the pillars can be located arbitrarily by design where desired and may take any one of a number of forms. Pillars may be encased by a teardrop base, as shown in FIG. 2(d) and FIG. 3(e) to provide a connection between a conductive interconnect and the pillar.

Figure 3:
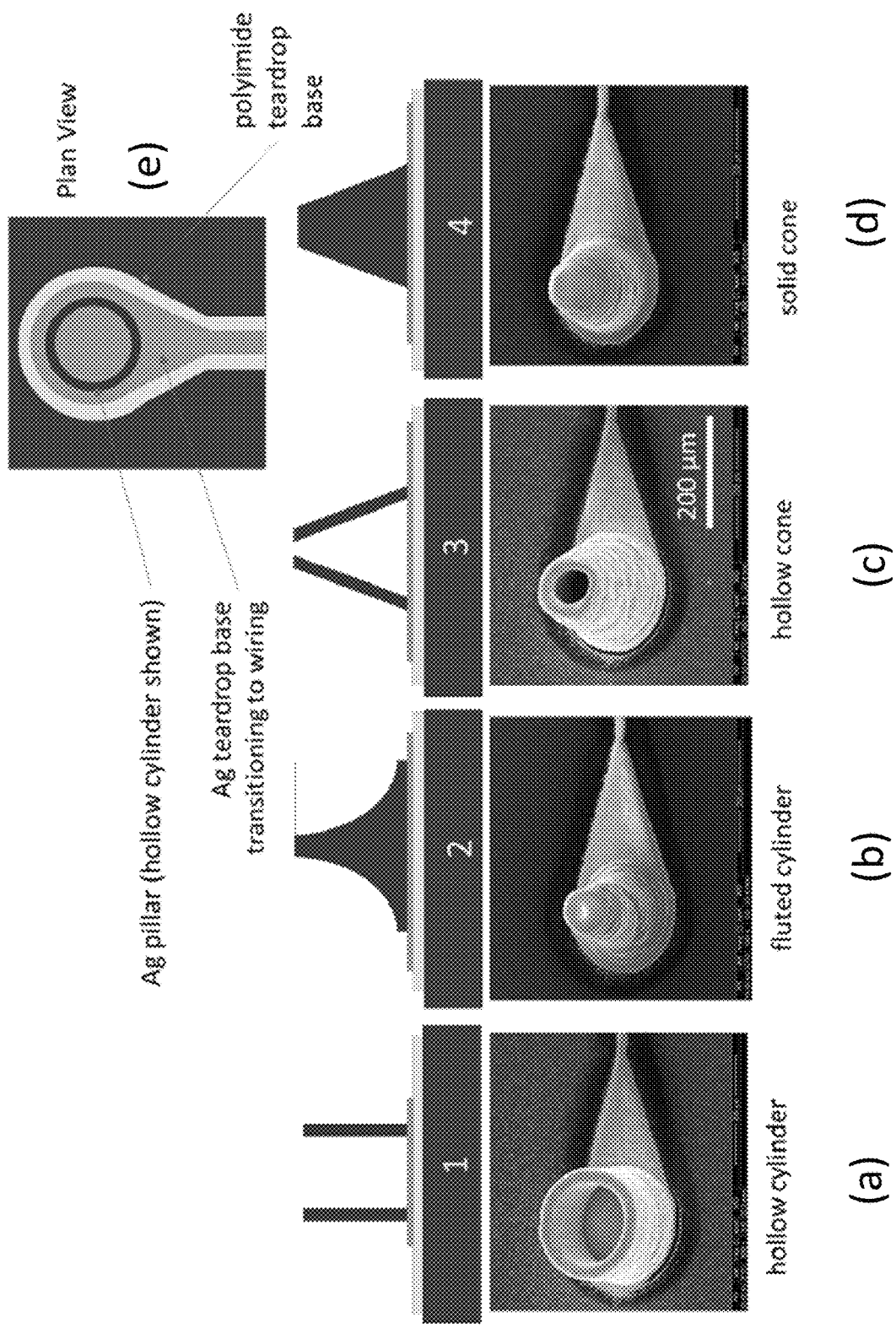
FIG. 3 is a schematic illustration of several embodiments of three-dimensional vias to interconnect layers in a multi-layer stretchable PCB, and SEM images of the three-dimensional vias produced by an additive manufacturing method in accordance with the process disclosed herein.

Several exemplary forms for the pillars are shown in FIG. 3. FIG. 3(a) shows a first exemplary pillar in the form of a straight, hollow cylinder. FIG. 3(b) shows a second exemplary pillar in the form of a fluted cylinder. FIG. 3(c) shows a third exemplary pillar in the form of a hollow frustum and FIG. 3(d) shows a fourth exemplary pillar in the form of a solid cone. As would be realized by one of skill in the art, other forms and configurations for the pillars are also possible. In some embodiments, when the pillar is hollow, the inside void of the pillar can be filled with polyimide to strengthen and stiffen the via, which can enable a parallel vertical polyimide to polyimide mechanical connection between subsequent interconnect layers. In some embodiments, the polyimide-filled hollow cylinder design variant can be important for strengthening vias in the presence of stress applied to the circuit.

Once pillars are formed and the top layer of polyimide is deposited and annealed for a given interconnect layer, an intermediate layer of PDMS can be spin cast to encase the layer and add to the overall thickness of the circuit. After curing the PDMS, it can be back etched for a fixed time in a solvent (e.g., Dynasolve 220) or with a plasma etch to expose the top of the pillars to provide vias to an additional layer of interconnects. Pillars placed at the topmost interconnect layer can serve as external pads or electrodes for external electrical connections. External electrodes may also be formed by etching holes in the initial layer of PDMS down to the PAA layer 206 and depositing the conductive material directly in the holes prior to deposition of the first interconnect layer. Alternatively, external electrodes may be formed by depositing conductive material directly on top of PAA release layer 206, including the deposition of conductive pillars that form vias connecting to a subsequent interconnect layer. In this case, a layer of PDMS on the bottom side could only be cast after the device release, if such a PDMS layer were desired.

Figure 4:
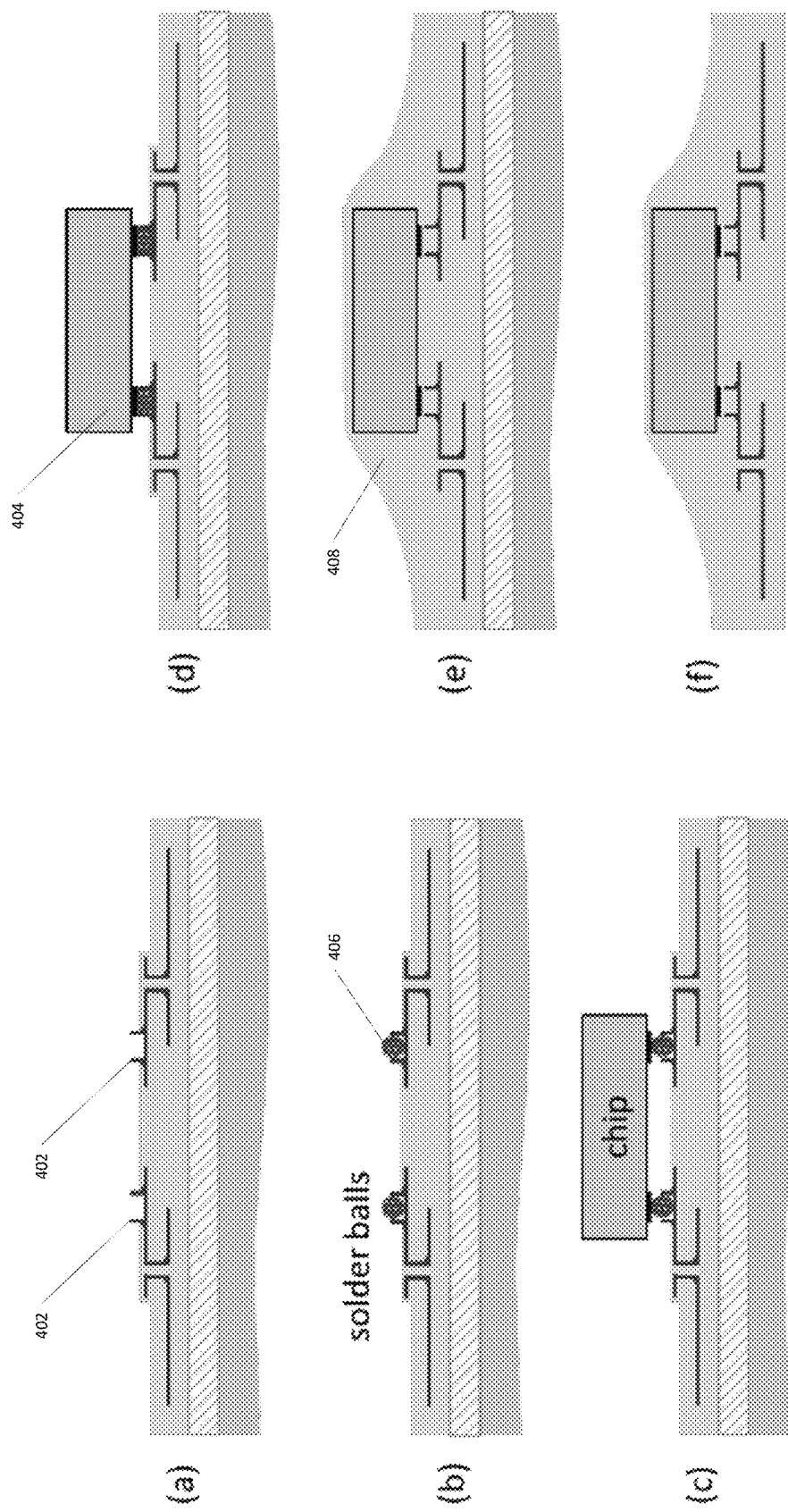
FIG. 4 comprises a series of schematic diagrams illustrating the basic process flow for production of the stretchable PCBs having circuit components integrated into the stretchable PCBs.

In a third key element of the invention, an extension to the pillar concept to interconnect components is shown in FIG. 4. In some embodiments, the invention includes shaped structures 402, much like the hollow cylinders previously described, that can be deposited to create electrical landing sites (referred to herein as "pads") that mate to a device 404 (e.g., a chip or other circuit component) that can be flip-chip placed or wire bonded on top of pads 402. In some embodiments, pads 402 may be designed to hold a low-temperature solder ball, jetted solder, silver epoxy or other electrically conductive bonding material 406. In some embodiments, the electrical connection can be completed by annealing at the solder temperature in a vacuum at or below 300° C. to not adversely affect the underlying PDMS. In an alternative embodiment, the invention contemplates mounting a device 404 and subsequently depositing AJP conductive interconnects on top of the component to electrically connect to the component. In this case, prior to silver deposition, polyimide may be deposited (e.g., by AJP) immediately adjacent to the device 404 to provide a less steep slope for the silver interconnect layer.

Subsequent deposition of PDMS 408 over a circuit component 404 can be an alternative step to encase the device and provide a mechanically stiff anchor to the underlying interconnect, as shown in FIGS. 4(e-f). In some embodiments, the invention includes an entire component that can then be encased in PDMS. In preferred embodiments, instantiation of embedded components occurs at the topmost interconnect layer such that the component thickness does not adversely impact succeeding layers nor does it adversely impact the total PDMS thickness in the field (i.e., in the main body of the stretchable circuit board).

In a fourth key element of the invention, mechanical stiffness gradients are formed in the substrate conductive material to inhibit delamination of interconnected components that may be embedded within the substrate. While the polyimide-encased interconnect layers are tough and create a stiffness gradient, in some embodiments, further patterned gradients of stiffness in the substrate may aid in preventing delamination of components, including interconnect layers detaching from the PDMS. In some embodiments, the stiffness gradient can be created by varying the amount of curing agent in the elastomer around stiffer components such as the interconnect or chip by adding extra curing agent by AJP. In some embodiments, patterned stiffness gradients can also provide the ability for strain engineering that may prove useful in concentrating stress to embedded sensors when desired as a means toward an end application (e.g., tactile sensors).

Figure 5:
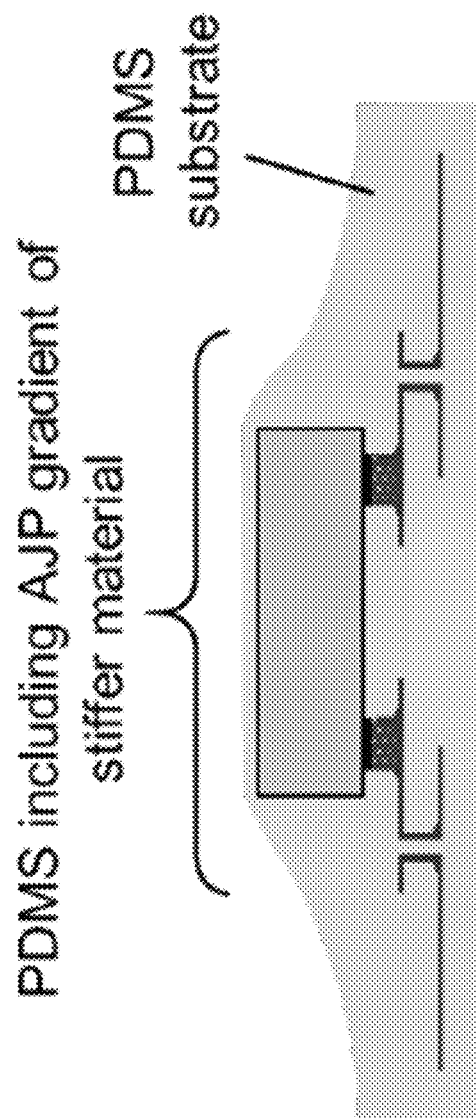
FIG. 5 is a schematic illustration of a mechanical stiffness gradient used in the circuit around circuit components.

To this end, the invention contemplates the deposition of small, precision volumes (e.g., droplets) of polyimide or other AJP-compatible polymers or nano-particles into the surrounding PDMS prior to the PDMS being cured or, alternatively, onto the PDMS after it is cured. A sketch of the deployment of such a gradient is shown in FIG. 5.

The invention is contemplated to include not only the process for manufacturing a multilayered device as described herein, but also the devices fabricated using the process. As would be realized by one of skill in the art, many variations on the process disclosed herein are possible and are contemplated to be within the scope of the invention. For example, the process may use a varying range of temperatures for the annealing and sintering's steps. In addition, alternative materials may be used, in particular, different elastomeric materials may be used in place of the PDMS and other electrically insulating polymers including high temperature engineering polymers with a higher Young's modulus than PDMS (e.g., 1 GPa) may be used in place of polyimide. In another variation, the conductive interconnects may be printed directly on the release layer (e.g., PAA) so that after the release of the device, the circuit appears on the surface of the elastomer substrate. Moreover, it is to be understood that the features of the various embodiments described herein are not mutually exclusive and can exist in various combinations and permutations, even if such combinations or permutations were not expressed herein, without departing from the spirit and scope of the invention. Accordingly, the description of specific process disclosed herein and devices fabricated in accordance with the process are not to be taken as limitations on the invention but as illustrations thereof. The scope of the invention is defined by the claims which follow.

The invention claimed is:

1. A method of fabricating a stretchable circuit comprising:
   encasing one or more conductive interconnects of the circuit in an insulating polymer to form an interconnect layer; and
   encasing the interconnect layer in an elastomeric material;
   wherein the circuit comprises multiple interconnect layers connected by pillars composed of a conductive material forming vias between the interconnect layers and through the intervening elastomeric material.

2. The method of claim 1 wherein the insulating polymer and the conductive interconnects are deposited via an aerosol-jet printing process.

3. The method of claim 2 wherein the conductive interconnects are deposited in nano-particle form via an aerosol-jet printing process and are thereafter sintered to form a solid mass.

4. The method of claim 1 wherein the elastomeric material is deposited via a spin coating process.

5. The method of claim 4 wherein the elastomeric material is annealed after depositing.

6. The method of claim 1 wherein the elastomeric material is PDMS.

7. The method of claim 1 wherein the insulating polymer is polyimide.

8. The method of claim 1 wherein creating an interconnect layer encased in elastomeric material comprises:
   providing a substrate coated with a sacrificial layer; and
   fabricating the plurality of layers of the circuit on the sacrificial layer, wherein fabrication of each layer of the circuit comprises:
      depositing a first layer of the elastomeric material on the sacrificial layer;
      depositing a first layer of an insulating polymer on the first layer of elastomeric material;
      depositing one or more conductive interconnects on the first layer of the insulating polymer;
      depositing a second layer of the insulating polymer over the conductive interconnects; and
      depositing a second layer of the elastomeric material over the second layer of the insulating polymer;
      wherein the second layer of elastomeric material acts as the first layer of elastomeric material for a next highest interconnect layer in the stack.

9. The method of claim 8 further comprising:
   depositing one or more pillars of conductive material in contact with the conductive interconnects in the interconnect layer, the one or more pillars extending through the second layer of elastomeric material; and
   trimming the second layer of elastomeric material to expose a top portion of the one or more pillars.

10. The method of claim 9 wherein one or more portions of the conductive interconnects form a pad on which the one or more pillars are deposited.

11. The method of claim 10 further comprising:
   depositing one or more conductive interconnects on an upper layer connected to the exposed top portion of the one or more pillars.

12. The method of claim 8 where the conductive interconnects are deposited in a meandering pattern.

13. The method of claim 9 wherein the one or more pillars are hollow.

14. The method of claim 13 wherein the one or more hollow pillars are in the shape of a cylinder or a frustum.

15. The method of claim 9 wherein the one or more hollow pillars are back filled with polyimide.

16. The method of claim 9 wherein the one or more pillars are in the shape of a fluted cylinder.

17. The method of claim 9 wherein the one or more pillars are generally cone-shaped.

18. The method of claim 9 further comprising:
   removing the sacrificial layer to release the stretchable circuit from the substrate.

19. The method of claim 18 wherein the sacrificial layer is composed of polyacrylic acid and further wherein the removing step comprises:
   exposing the sacrificial layer to a saltwater solution.

20. The method of claim 8 wherein the elastomeric material is deposited by a spin coating process.

21. The method of claim 8 wherein the elastomeric material is PDMS.

22. The method of claim 8 wherein the insulating polymer is polyimide.

23. The method of claim 8 wherein each layer of the insulating polymer is deposited by an aerosol-jet printing process.

24. The method of claim 8 wherein the conductive interconnects are deposited in nano-particle form via an aerosol-jet printing process, the method further comprising:
   sintering the conductive interconnects.

25. The method of claim 24 wherein the sintering process comprises:
   exposing the circuit to an intermediate temperature in an ambient environment with oxygen for a predetermined period of time;

placing the circuit in a vacuum; and raising the temperature to a sintering temperature appropriate for the material of which the conductive interconnects are composed.

26. The method of claim 25 wherein the intermediate temperature is approximately 150° C. and the predetermined period of time is approximately 15 minutes.

27. The method of claim 25 wherein the conductive interconnects are composed of silver and further wherein the sintering temperature is in the range of 200° C. to 300° C.

28. The method of claim 8 further comprising:

exposing the circuit to an intermediate drying step after the second layer of the insulating polymer has been deposited.

29. The method of claim 28 wherein the intermediate drying step occurs at approximately 150° C. for approximately 15 minutes.

30. The method of claim 8 wherein the conductive interconnects and the pillars are composed of a material selected from a group comprising: silver, gold, platinum, copper, nickel and conductive polymers.

31. The method of claim 8 further comprising:

forming one or more pads connected to at least one of the conductive interconnects; and connecting a component of the circuit to one or more of the pads.

32. The method of claim 31 wherein the one or more pads are hollow, further comprising:

filling the hollow of the pads with a solder compound; and melting the solder to connect a component of the circuit to one or more of the pads.

33. The method of claim 32 further comprising:

covering components of the circuit with a layer of the elastomeric material.

34. The method of claim 33 wherein the elastomeric material is infused with a polymer having a stiffness greater than the elastomeric material in areas where the elastomeric material covers the components of the circuit.

35. The method of claim 32 further comprising:

covering the components of the circuit with the insulating polymer; and covering the insulating polymer with a layer of the elastomeric material.

36. The method of claim 35 wherein the elastomeric material is infused with polymer having a stiffness greater than the elastomeric material in areas where the elastomeric material covers the components of the circuit.

37. The method of claim 1 wherein creating an interconnect layer encased in elastomeric material comprises:

providing a substrate coated with a sacrificial layer;

depositing one or more conductive pillars on the sacrificial layer;

depositing a first layer of the elastomeric material over the sacrificial layer and the conductive pillars; and fabricating one or more additional interconnect layers of the circuit, wherein fabrication of each additional interconnect layer of the circuit comprises:

trimming a top portion of the elastomeric material from the interconnect layer below;

depositing a first layer of an insulating polymer on the first layer of elastomeric material;

depositing one or more conductive interconnects on the first layer of the insulating polymer;

depositing a second layer of the insulating polymer over the conductive interconnects; and depositing a layer of the elastomeric material over the second layer of the insulating polymer.

38. The method of claim 37 further comprising:

depositing a layer of the insulating polymer over the conductive interconnects deposited on the sacrificial layer.

39. The method of claim 37 further comprising:

depositing one or more pillars of conductive material in contact with the conductive interconnects on an interconnect layer, the one or more pillars extending through the elastomeric material; and trimming the elastomeric material to expose a top portion of the one or more pillars.

40. The method of claim 37 wherein the insulating polymer is polyimide and further wherein the elastomeric material is PDMS.

* * * * *